(12) United States Patent
Kreupl et al.

(10) Patent No.: US 7,894,253 B2
(45) Date of Patent: Feb. 22, 2011

(54) CARBON FILAMENT MEMORY AND FABRICATION METHOD

(75) Inventors: Franz Kreupl, Munich (DE); Michael Kund, Tuntenhausen (DE); Klaus-Dieter Ufert, Unterschleissheim (DE)

(73) Assignee: Qimonda AG, Munich (DE)

( * ) Notice: Subject to any disclaimer, the term of this patent is extended or adjusted under 35 U.S.C. 154(b) by 287 days.

(21) Appl. No.: 11/708,757

(22) Filed: Feb. 20, 2007

(65) Prior Publication Data

US 2008/0099752 A1 May 1, 2008

Related U.S. Application Data

(63) Continuation-in-part of application No. 11/588,864, filed on Oct. 27, 2006, now abandoned.

(51) Int. Cl.
*G11C 11/00* (2006.01)
(52) U.S. Cl. ............... 365/163; 365/148; 365/174; 257/3; 257/40
(58) Field of Classification Search ............... 365/163, 365/148, 174; 257/3, 40
See application file for complete search history.

(56) References Cited

U.S. PATENT DOCUMENTS

| | | | |
|---|---|---|---|
| 3,361,638 A | 1/1968 | Bokros et al. | |
| 3,692,565 A | 9/1972 | Lersmacher et al. | |
| 4,077,044 A | 2/1978 | Hayashi | |
| 4,262,039 A | 4/1981 | Gyarmati et al. | |
| 4,599,705 A | 7/1986 | Holmberg et al. | |
| 4,845,533 A * | 7/1989 | Pryor et al. | 257/4 |
| 5,086,014 A | 2/1992 | Miyata et al. | |
| 5,211,796 A | 5/1993 | Hansen | |
| 5,278,431 A | 1/1994 | Das | |
| 5,294,518 A | 3/1994 | Brady et al. | |
| 5,294,814 A | 3/1994 | Das | |
| 5,330,630 A | 7/1994 | Klersy et al. | |
| 5,341,328 A | 8/1994 | Ovshinsky et al. | |
| 5,440,507 A | 8/1995 | Brady et al. | |
| 6,139,624 A | 10/2000 | Rupp | |
| 6,180,444 B1 | 1/2001 | Gates et al. | |
| 6,194,746 B1 | 2/2001 | Gonzalez et al. | |
| 6,235,645 B1 | 5/2001 | Habuka et al. | |

(Continued)

FOREIGN PATENT DOCUMENTS

CN 1466218 1/2004

(Continued)

OTHER PUBLICATIONS

Liu, L., et al., "Controllable Reversibility of an $sp^2$ to $sp^3$ Transition of a Single Wall Nanotube under the Manipulation of an AFM Tip: A Nanoscale Electromechanical Switch?," The American Physical Society, Physical Review Letters, vol. 84, No. 21, May 22, 2000, pp. 4950-4953.

(Continued)

*Primary Examiner*—Viet Q Nguyen (57) ABSTRACT

An integrated circuit is described, including a memory element including a first carbon layer rich in a first carbon material and a second carbon layer rich in a second carbon material. The memory element stores information by reversibly forming a conductive channel in the second carbon layer, wherein the conductive channel includes the first carbon material.

44 Claims, 9 Drawing Sheets

U.S. PATENT DOCUMENTS

| | | | |
|---|---|---|---|
| 6,392,913 | B1 | 5/2002 | Sandhu |
| 6,565,718 | B1 * | 5/2003 | Chour et al. ............ 204/192.15 |
| 6,614,048 | B2 | 9/2003 | Leuschner |
| 6,683,322 | B2 * | 1/2004 | Jackson et al. ................. 257/40 |
| 6,750,469 | B2 | 6/2004 | Ichihara et al. |
| 6,903,361 | B2 | 6/2005 | Gilton |
| 6,937,505 | B2 | 8/2005 | Morikawa |
| 7,045,175 | B2 * | 5/2006 | Fujimaki et al. ............ 427/523 |
| 7,052,757 | B2 * | 5/2006 | Chaiken et al. ............ 428/64.1 |
| 7,186,380 | B2 | 3/2007 | Chen et al. |
| 7,220,982 | B2 * | 5/2007 | Campbell ....................... 257/3 |
| 7,268,077 | B2 * | 9/2007 | Hwang ........................ 438/680 |
| 7,332,262 | B2 * | 2/2008 | Latchford et al. ............ 430/311 |
| 7,339,811 | B2 | 3/2008 | Nejad et al. |
| 7,344,946 | B2 * | 3/2008 | Moore et al. ................. 438/285 |
| 7,433,253 | B2 * | 10/2008 | Gogl et al. ................... 365/209 |
| 7,453,716 | B2 | 11/2008 | Kim et al. |
| 7,492,635 | B2 | 2/2009 | Kim et al. |
| 7,539,038 | B2 * | 5/2009 | Lee et al. ..................... 365/148 |
| 7,626,190 | B2 * | 12/2009 | Seidl .............................. 257/2 |
| 7,692,175 | B2 * | 4/2010 | Pinnow et al. ................... 257/2 |
| 2005/0127524 | A1 | 6/2005 | Sakamoto et al. |
| 2005/0201143 | A1 | 9/2005 | Pinnow et al. |
| 2005/0274942 | A1 | 12/2005 | Kozicki |
| 2006/0038212 | A1 | 2/2006 | Moore et al. |
| 2006/0152961 | A1 | 7/2006 | Kim et al. |
| 2006/0256608 | A1 | 11/2006 | Chen et al. |
| 2007/0010094 | A1 | 1/2007 | Kreupl et al. |
| 2007/0045615 | A1 | 3/2007 | Cho et al. |
| 2008/0070162 | A1 | 3/2008 | Ufert |
| 2008/0101121 | A1 * | 5/2008 | Kreupl .................. 365/185.14 |

FOREIGN PATENT DOCUMENTS

| | | |
|---|---|---|
| DE | 43 19 268 A1 | 6/1992 |
| DE | 692 14 846 T2 | 2/1997 |
| DE | 198 56 295 C2 | 6/2002 |
| DE | 103 06 076 A1 | 8/2004 |
| DE | 103 45 393 A1 | 5/2005 |
| DE | 10 2004 011 363 A1 | 9/2005 |
| EP | 0 269 225 A2 | 6/1988 |
| EP | 0 457 508 A2 | 11/1991 |
| EP | 0 519 472 A2 | 12/1992 |
| EP | 0 714 136 A1 | 5/1996 |
| EP | 1 892 722 A1 | 2/2008 |
| JP | 05-315595 | 11/1993 |
| JP | 02008153624 A * | 7/2008 |
| KR | 10-2004-0111563 | 12/2004 |
| KR | 10-0630437 | 9/2006 |
| WO | WO 98/45847 | 10/1998 |
| WO | WO 2004/070735 A1 | 8/2004 |
| WO | WO 2005/081296 A1 | 9/2005 |

OTHER PUBLICATIONS

Gerstner, E.G., "Bistability in a-C for Memory and Antifuse Applications," XP-002402610, Section 10.3, Jun. 2001, pp. 318-323.

McKenzie, D.R., et al., "Applications of Tetrahedral Amorphous Carbon in Limited Volatility Memory and in Field Programmable Gate Arrays," Diamond and Related Materials, vol. 10, 2001, pp. 230-233.

Bhattacharyya, S., et al. "Resonant tunnelling and fast switching in amorphous-carbon quantum-well structures," Nature Materials, vol. 5, Jan. 2006, pp. 19-22.

Savvides, N., "Four-fold to three-fold transition in diamond-like amorphous carbon films: A study of optical and electrical properties," Journal of Applied Physics, vol. 58, No. 1, Jul. 1, 1985, pp. 518-521.

Takai, K., et al., "Structure and electronic properties of a nongraphitic disordered carbon system and its heat-treatment effects," Physical Review B, vol. 67, 2003, pp. 214202-1-214202-11.

Seo, S., et al., "Reproducible resistance switching in polycrystalline NiO films," Applied Physics Letters, vol. 85, No. 23, Dec. 6, 2004, 5655-5657.

Hiatt, W.R., et al., "Bistable Switching in Niobium Oxide Diodes," Applied Physics Letters, vol. 6, No. 6, Mar. 15, 1965, pp. 106-108.

Gibbons, J.F., et al., "Switching Properties of Thin NiO Films," Solid-State Electronics, vol. 7, 1964, pp. 785-797.

Argall, F., "Switching Phenomena in Titanium Oxide Thin Films," Solid-State Electronics, vol. 11, 1968, pp. 535-541.

Seo, S., et al., "Conductivity switching characteristics and reset currents in NiO films," Applied Physics Letters, vol. 86, 2005, pp. 093509-1-093509-3.

Baek, I.G., et al., "Highly Scalable Non-volatile Resistive Memory using Simple Binary Oxide Driven by Asymmetric Uni-polar Voltage Pulses," IEDM 2004, Samsung Advanced Institute of Technology, 26 pages.

Gerstner, E.G., et al., "Nonvolatile memory effects in nitrogen doped tetrahedral amorphous carbon thin films," Journal of Applied Physics, vol. 84, No. 10, Nov. 15, 1998, pp. 5647-5651.

Aichmayr, G., et al., "Carbon/high-k Trench Capacitor for the 40nm DRAM Generation," Symposium on VLSI Technology Digest of Technical Papers, 2007, pp. 186-187.

Lu, W., et al., "Ohmic Contact Behavior of Carbon Films on SiC," Journal of The Electrochemical Society, Jan. 23, 2003, pp. G177-G182.

Davanloo, F., et al., "Amorphic Diamond/Silicon Semiconductor Heterojunctions Exhibiting Photoconductive Characteristics," Applied Physics Letters, American Institute of Physics, Sep. 18, 2000, vol. 77, No. 12., pp. 1837-1839.

Raghavan, G., et al., "Polycrystalline Carbon: A Novel Material for Gate Electrodes in MOS Technology," Japan Journal of Applied Physics, Jan. 1993, pp. 380-383, vol. 32, Part 1, No. 1B.

Oberlin, A., "Pyrocarbons," Elsevier Science Ltd., Carbon 40, May 15, 2001, pp. 7-24.

* cited by examiner

CARBON FILAMENT MEMORY AND FABRICATION METHOD

CROSS-REFERENCES TO RELATED APPLICATIONS

This application is a continuation-in-part of U.S. patent application Ser. No. 11/588,864, entitled "Carbon Filament Memory and Method for Fabrication," filed Oct. 27, 2006 now abandoned.

TECHNICAL FIELD

The present invention relates generally to memories and in one embodiment to a carbon filament memory.

BACKGROUND

Nonvolatile memory retains its stored data even when power is not present. This type of memory is used in a wide variety of electronic equipment, including digital cameras, portable audio players, wireless communication devices, personal digital assistants, and peripheral devices, as well as for storing firmware in computers and other devices.

Nonvolatile memory technologies include flash memory, magnetoresistive random access memory (MRAM), phase change random access memory (PCRAM), and conductive bridging random access memory (CBRAM). Due to the great demand for nonvolatile memory devices, researchers are continually developing new types of nonvolatile memory.

SUMMARY OF THE INVENTION

An embodiment of the invention provides an integrated circuit including a memory element including a first carbon layer rich in a first carbon material and a second carbon layer rich in a second carbon material. The memory element stores information by reversibly forming a conductive channel in the second carbon layer, wherein the conductive channel includes the first carbon material.

These and other features of the invention will be better understood when taken in view of the following drawings and a detailed description.

BRIEF DESCRIPTION OF THE DRAWINGS

In the drawings, reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION OF ILLUSTRATIVE EMBODIMENTS

Figure 1A:
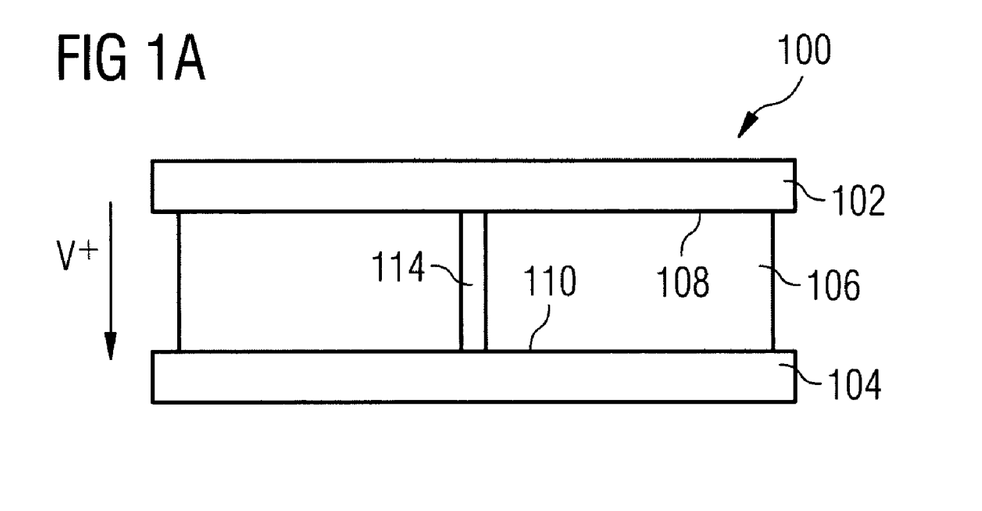
FIGS. 1A and 1B show a conventional conductive bridging memory element.

FIG. 1A shows a conventional conductive bridging junction (CBJ) for use in a conductive bridging random access memory (CBRAM) cell. A CBJ 100 includes a first electrode 102, a second electrode 104, and a solid electrolyte block 106 sandwiched between the first electrode 102 and the second electrode 104. The first electrode 102 contacts a first surface 108 of the solid electrolyte block 106, the second electrode 104 contacts a second surface 110 of the solid electrolyte block 106. One of the first electrode 102 and the second electrode 104 is a reactive electrode, the other one an inert electrode. In this example the first electrode 102 is the reactive electrode, and the second electrode 104 is the inert electrode. The first electrode 102 includes silver (Ag), the solid electrolyte block 106 includes a silver-doped chalcogenide material.

When a voltage is applied across the solid electrolyte block 106, a redox reaction is initiated that drives Ag+ ions out of the first electrode 102 into the solid electrolyte block 106 where they are reduced to Ag, thereby forming Ag rich clusters within the solid electrolyte block 106. If the voltage applied across the solid electrolyte block 106 is applied for a long period of time, the size and the number of Ag rich clusters within the solid electrolyte block 106 is increased to such an extent that a conductive bridge 114 between the first electrode 102 and the second electrode 104 is formed.

Figure 1B:
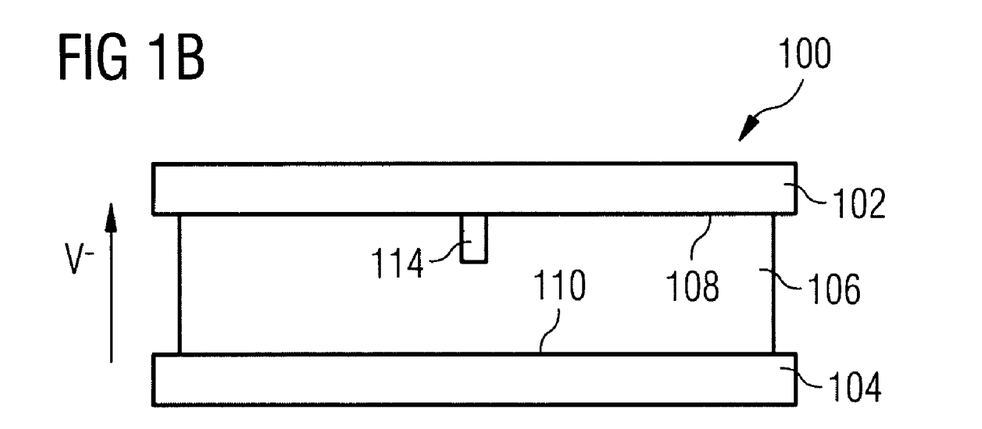

As shown in FIG. 1B, when an inverse voltage to that applied in FIG. 1A is applied across the solid electrolyte 106, a redox reaction is initiated that drives Ag+ ions out of the solid electrolyte block 106 into the first electrode 102 where they are reduced to Ag. As a consequence, the size and the number of Ag rich clusters within the solid electrolyte block 106 are reduced, thereby reducing, and eventually removing the conductive bridge 114.

To determine the current memory state of the CBJ 100, a sensing current is routed through the CBJ 100. The sensing current encounters a high resistance if no conductive bridge 114 exists within the CBJ 100, and a low resistance when a conductive bridge 114 is present. A high resistance may, for example, represent "0", while a low resistance represents "1", or vice versa.

In accordance with an embodiment of the invention, a process of forming a reversible conductive filament may be used to construct an information storage element using a carbon layer system including layers of $sp^2$-rich and $sp^3$-rich (also known as diamond-like carbon, or DLC) amorphous carbon films.

Figure 2A:
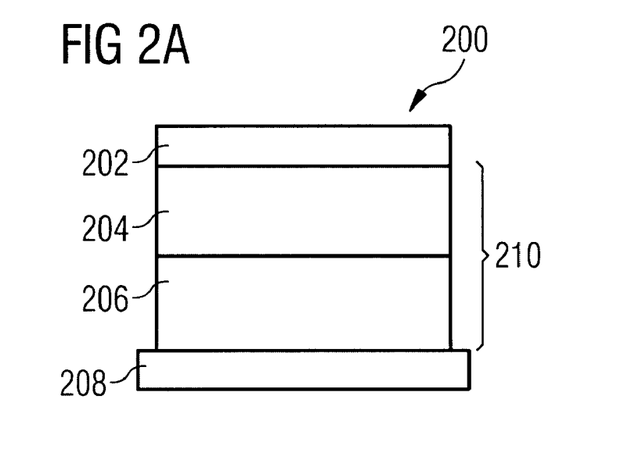
FIGS. 2A, 2B, and 2C show a carbon filament memory element in accordance with an embodiment of the invention.

Referring to FIG. 2A, an embodiment of a memory junction in accordance with an embodiment of the invention is described. A memory junction 200 includes a top contact 202, a first carbon layer 204 including an amorphous carbon material rich in $sp^2$ hybridized carbon atoms, a second carbon layer 206 including an amorphous carbon material rich in $sp^3$ hybridized carbon atoms, and a bottom contact 208. The first carbon layer 204 and second carbon layer 206 form a carbon bi-layer system 210 in which a conductive filament may be formed, as described further below. Generally, the $sp^2$-rich carbon is conductive, while the $sp^3$-rich carbon is an electrical insulator, having low conductivity. If the resistance of the first carbon layer 204 (i.e., the $sp^2$-rich carbon layer) is denoted as R1, and the resistance of the second carbon layer 206 (the $sp^3$-rich layer) is R2, for many embodiments the ratio R2/R1 may be greater than 100, for example greater than 1000, e.g., greater than 10000.

Figure 2B:
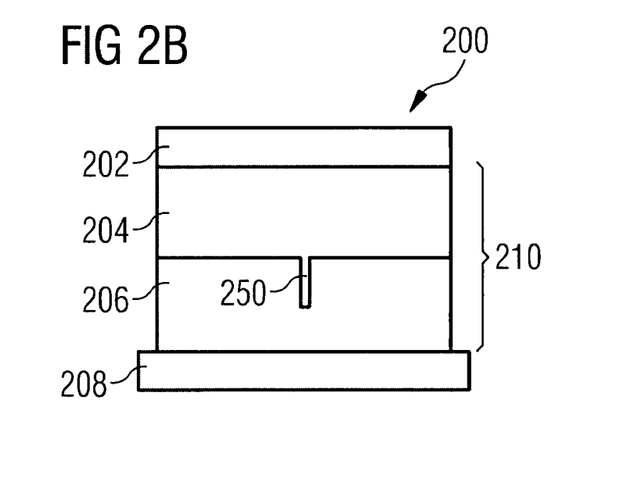
Figure 2C:
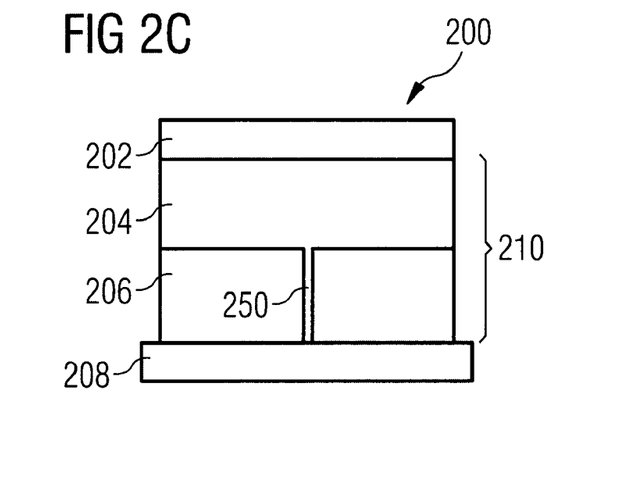

As shown in FIGS. 2B and 2C, by forcing a current through the carbon bi-layer system 210, an $sp^2$ filament 250 can be formed in the $sp^3$-rich second carbon layer 206, changing the conductivity (and resistance) of the carbon bi-layer system. Within the second carbon layer 206, the current causes a change in the structure of the material, from atomic scale $sp^2/sp^3$ disorder to a disordered graphitic sp 2-domain network, through the migration of $sp^3$ defects. The current induces the migration of $sp^2$-rich clusters to form a percolation path network of graphitic $sp^2$ domains, which causes an insulator-to-metal transition. Electron transport in the $sp^2$-rich metallic state features weakly temperature-dependent conductivity with a majority of hole and a minority of electron carriers. A one-dimensional channel arises due to filamentary conduction through localized $sp^2$-rich regions within the $sp^3$ carbon barriers, and particularly within the barrier adjacent to the electron injector. This limits the electrical conduction at low bias. Additionally, this may involve the orientation of π orbitals of $sp^2$-bonded carbon molecules when subject to a high electric field, leading to increased electron transmission, although the present invention is not limited to a particular theory of operation.

Application of a current with reversed polarity reverses the migration of $sp^2$ domains in the $sp^3$-rich second carbon layer 206, reducing the $sp^2$ filament 250, and the conductivity (and increasing the resistance) of the carbon bi-layer system 210. The reversibility of the formation of $sp^2$ filaments permits the carbon bi-layer system 210 to be used as the basis of a memory cell, in which the states of the memory cell are represented by the high and low conductivity (corresponding to low and high resistance) of the carbon bi-layer system 210.

While formation of filaments would occur even in the absence of the $sp^2$-rich first carbon layer 204, the reliable creation of $sp^2$ filaments in $sp^3$-rich material can be substantially enhanced by the presence of an $sp^2$-rich layer, such as the first carbon layer 204.

The thickness of the $sp^3$-rich second carbon layer 206 is related to the desired voltages and speed for the operation of the memory. Switching (i.e., formation or removal of filaments) may occur in an electric field of less than one volt per nm of thickness of the material. For example, for an operating voltage of 3V, the thickness of the second carbon layer 206 may be approximately 4 nm. The thickness of the $sp^2$-rich first carbon layer 204 does not have a substantial effect, and the first carbon layer 204 may have almost any thickness, from a monolayer to a thickness of hundreds of nm.

Figure 3:
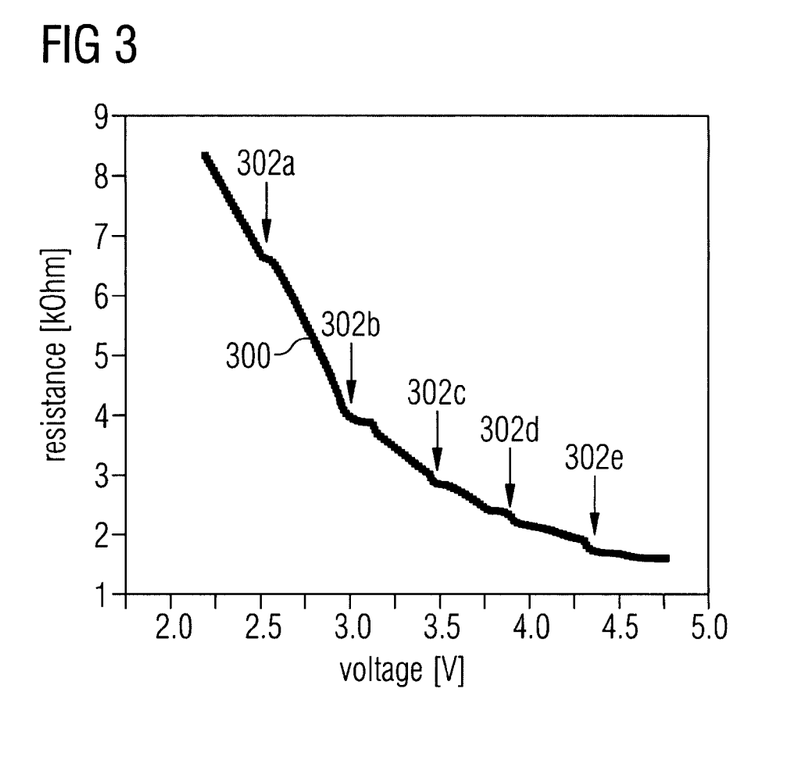
FIG. 3 is a graph showing different resistances in a carbon filament memory element in accordance with an embodiment of the invention.

As the applied voltage is increased, additional conducting channels may form in the $sp^3$-rich second carbon layer 206, providing different resistances that may be used in some embodiments for multi-bit storage in a single memory cell. FIG. 3 shows a curve 300 representing the resistance in an 8 nm thick $sp^3$-rich film, as voltage varies. The curve 300 includes quantized resistance steps 302a-302e, in multiples of $h/(2e^2)$, where h is Planck's constant and e is the electron charge, indicating the formation of additional conducting channels in the $sp^3$-rich carbon film.

Figure 4:
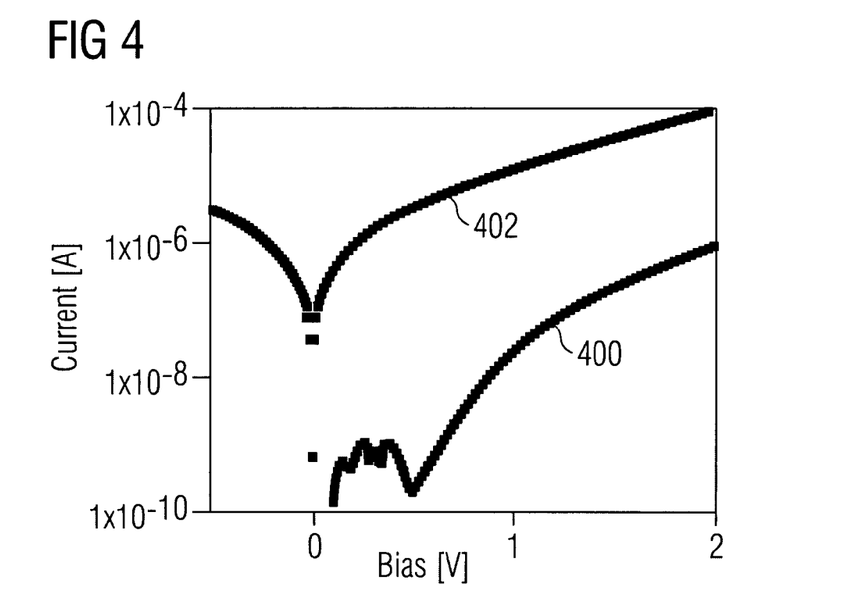
FIG. 4 is a graph showing V-I curves that demonstrate the memory effect of a carbon filament memory element in accordance with an embodiment of the invention.

FIG. 4 illustrates the memory effect following the application of voltage to an $sp^3$-rich film. The I-V curve 400 shows the current/voltage relationship for an approximately 8 nm thick $sp^3$-rich film prior to the formation of carbon filaments in the $sp^3$-rich film. The I-V curve 402 shows the current/voltage relationship after formation of filaments using a voltage pulse of approximately 6 volts, demonstrating the memory effect.

Figure 5:
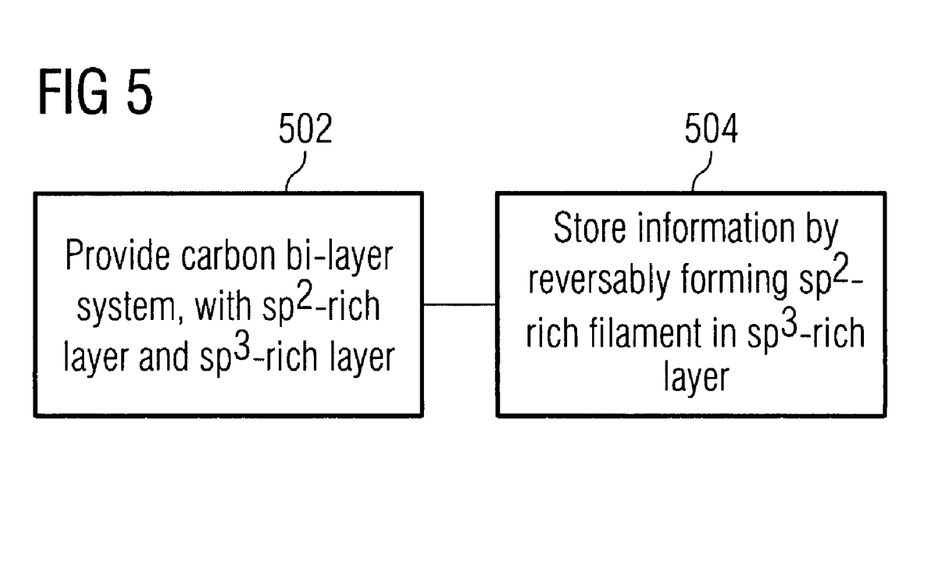
FIG. 5 is a block diagram of a method for storing information in accordance with an embodiment of the invention.

FIG. 5 shows a block diagram of a method for storing information according to an embodiment of the invention. In step 502, a carbon bi-layer system, as described above, including an $sp^2$-rich amorphous carbon layer and an $sp^3$-rich amorphous carbon layer is provided. In step 504, information is stored in the carbon bi-layer system by applying a current through the carbon bi-layer system to cause the growth of a filament of $sp^2$-rich carbon in the $sp^3$-rich layer, decreasing the resistance of the carbon bi-layer system. By applying a current with reversed polarity, the growth of the filament can be reversed. Additionally, quantized resistance steps, such as are shown in FIG. 3, can be used to store multiple bits of information in the carbon bi-layer system.

Figure 6:
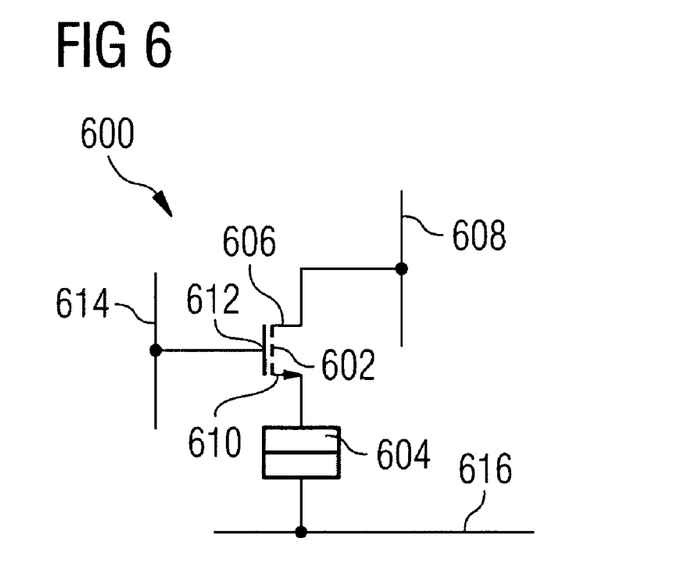
FIG. 6 is a schematic diagram of a memory cell in accordance with an embodiment of the invention.

FIG. 6 shows an illustrative memory cell that uses a memory junction such as is shown in FIGS. 2A-2C, with still others being apparent to workers in the art and included herein. The memory cell 600 includes a select transistor 602 and a memory junction 604, which uses a carbon bi-layer system, in accordance with the invention. The select transistor 602 includes a source 606 that is connected to a bit line 608, a drain 610 that is connected to the memory junction 604, and a gate 612 that is connected to a word line 614. The memory junction 604 is also connected to a common line 616, which may be connected to ground, or to other circuitry, such as circuitry (not shown) for determining the resistance of the memory cell 600, for use in reading. It should be noted that as used herein the terms connected and coupled are intended to include both direct and indirect connection and coupling, respectively.

To write to the memory cell, the word line 614 is used to select the cell 600, and a current on the bit line 608 is forced through the memory junction 604, to form or remove filaments in the memory junction 604, changing the resistance of the memory junction 604. Similarly, when reading the cell 600, the word line 614 is used to select the cell 600, and the bit line 608 is used to apply a voltage across the memory junction 604 to measure the resistance of the memory junction 604.

The memory cell 600 may be referred to as a 1T1J cell, because it uses one transistor, and one memory junction. Typically, a memory device will include an array of many such cells. It will be understood that other configurations for a 1T1J memory cell could be used with a carbon bi-layer memory junction according to the invention. Additionally, cell configurations other than a 1T1J configuration may be used.

Figure 7:
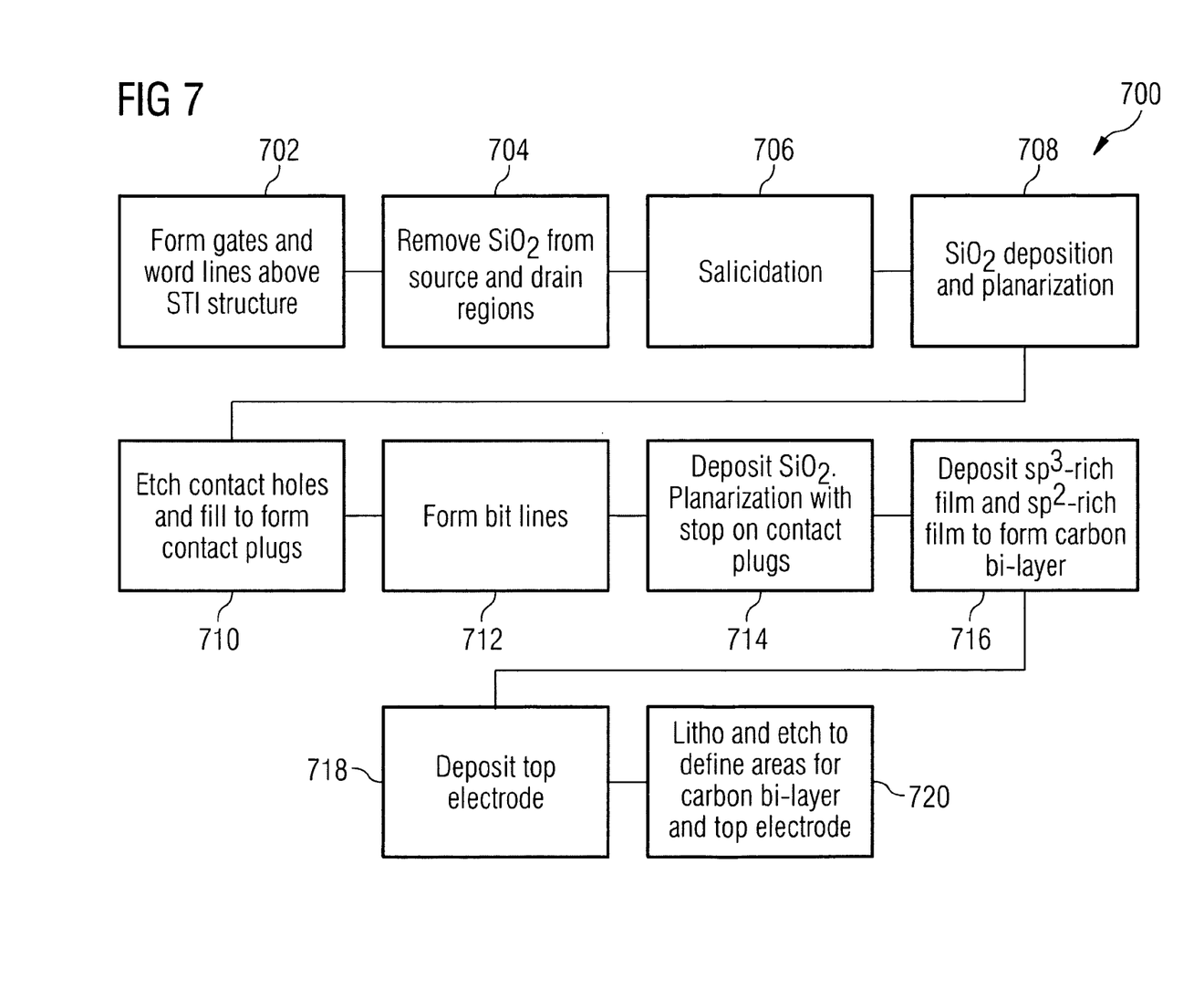
FIG. 7 is a block diagram showing a method for manufacturing an array of memory cells in accordance with an embodiment of the invention.

Referring to FIG. 7, an illustrative method for manufacturing an integrated circuit including an array of 1T1J memory cells that have a memory junction using a carbon layer system in accordance with an embodiment of the invention is described. However, the manufacturing may be accomplished by any method known in the art or hereafter developed that is suitable for forming the inventive structure.

At the start of the method 700, a shallow trench isolation (STI) structure in the array and periphery has been manufactured on a semiconductor wafer or other suitable substrate. In step 702, gates and word lines are formed above the STI structure. This involves the conventional application of a gate oxide layer, gate conductor deposition and structuring, sidewall spacer formation, and related implants.

In step 704 $SiO_2$ is removed from the source and drain regions. This may be accomplished, for example, through the application of diluted HF. Optionally, selective epitaxial growth of Si may be used to form elevated source and drain regions.

This is followed, in step 706, by a salicidation process, for example forming CoSi, NiSi, TiSi, or another suitable silicide. Salicidation can be omitted in parts or in all of the periphery by using a blocking mask. Optionally, salicided areas where no contacts will be manufactured may be covered with resist.

Step 708 is an ILD (Interlayer Dielectric) deposition step which can be, for example, an $SiO_2$ deposition and planarization step, which is followed in step 710 by etching contact holes (vias) and filling them with contact plugs including a suitable conductive material, such as W, poly-Si, or a conductive carbon material. Back etching and planarization may be used to prepare a level surface for the wafer.

In step 712, bit lines are formed, which are connected to the common source of two neighboring transistors. This may be achieved by using a lithographic process to mask portions of the $SiO_2$ layer, etching the $SiO_2$ and the common source contact plug for formation of the bit lines. This is followed by deposition of the bit lines (using poly-Si, W, or other suitable conductive materials) and recess.

In step 714, further (ILD) $SiO_2$ is deposited, burying the bit lines. Chemical mechanical polishing (CMP) may be used for planarization, stopping on the contact plugs, to prepare the surface for further steps.

In step 716, the $sp^3$-rich and $sp^2$-rich carbon layers are deposited to form the carbon bi-layer system for the memory junction. Deposition of these layers may be achieved by physical vapor deposition (PVD), chemical vapor deposition (CVD), plasma enhanced chemical vapor deposition (PECVD), ablation of a graphite target using a 248 nm pulsed ultraviolet excimer laser, or another suitable method of depositing a material on a substrate.

The $sp^2$ to $sp^3$ ratio in the deposited carbon materials may be varied by a number of methods, depending on the deposition technique used. For example, if the carbon layers are produced using PECVD deposition, the ratio may be controlled by adjusting the bias voltage, gas pressure, and temperature during the deposition of the material. For example, the PECVD process may be carried out in an inductively coupled high-density plasma with a stimulation frequency of approximately 20 MHz to approximately 40 MHz, e.g., with a stimulation frequency of approximately 25 MHz to approximately 30 MHz, e.g., with a stimulation frequency of approximately 27.26 MHz. In this case, the substrate, including the layer stack that has already been manufactured, is placed on a substrate holder where it is possible to apply an RF bias voltage. Additional ions having the appropriate energy can be pulled onto the substrate by means of the RF bias voltage. Additionally, the substrate can be heated. In some embodiments, $C_xH_y$ (x and y are arbitrary natural number), e.g., $C_2H_2$ or $CH_4$, can be used as the reactive gas. Optionally, the reactive gas can be diluted using Ne, $H_2$ or Ar.

The level of the substrate bias voltage is determined by the reactor geometry (i.e. the ratio of the dimensions of the mass carrying electrode and the RF carrying electrode in the reactor), and by the self-bias, which is applied or is adjusted to by an externally applied capacitively coupled-in RF field. In particular, the externally applied capacitively coupled-in RF field determines the layer characteristics and, for example, the occurring bondings, such as $sp^3$ or $sp^2$ bondings, and their relative amount and mixture. In an exemplary embodiment, a negative voltage in the range of approximately 50 V to approximately 350 V is applied together with a gas pressure in the range of approximately 10 mTorr to approximately 500 mTorr. For a low conductivity layer a small voltage of, e.g., 50 V may be applied and for a highly conductive layer a voltage of, e.g., 300 V may be applied.

Alternatively, the ratio of $sp^2$ to $sp^3$ may be determined by forming the layers by sputtering. This may be achieved, for example, using a graphite target in an argon atmosphere, at a pressure of approximately 1 Pa, with the substrate approximately 3 cm from the target. By varying the temperature in a range of approximately 77 K to 500 K, and the sputtering power from approximately 5 W to approximately 300 W, the resistivity of the material may be varied. For a low conductivity layer a small power of, e.g., 5 W may be applied and for a highly conductive layer a power of, e.g., 300 W may be applied.

Alternatively, the ratio of $sp^2$ to $sp^3$ may be determined by forming the layers by laser ablation. A 248 nm pulsed ultraviolet excimer laser (e.g., Lambda Physik LPX 210i) at a chamber pressure of approximately $10^{-7}$ mbar may be employed, and the fluence of the laser may be varied to synthesize two types of amorphous-carbon layers (using, for example, approximately 4 J $cm^{-2}$ for sp2-rich layers and approximately 20 J $cm^{-2}$ for sp3-rich layers).

The amounts of $sp^2$ and $sp^3$ hybridized carbon present in a deposited film may also be adjusted by post-deposition annealing, or by other conventional techniques for depositing films of diamond-like carbon.

In step 718, the top electrode, including a highly conductive material such as poly-Si, W, Ti, or Ta is deposited above the carbon bi-layer system.

In step 720, lithography and etching are used to define the areas covered by the carbon bi-layer system and top electrode. Following this step, additional processing of the semiconductor wafer may be performed using conventional processes.

Figure 8A:
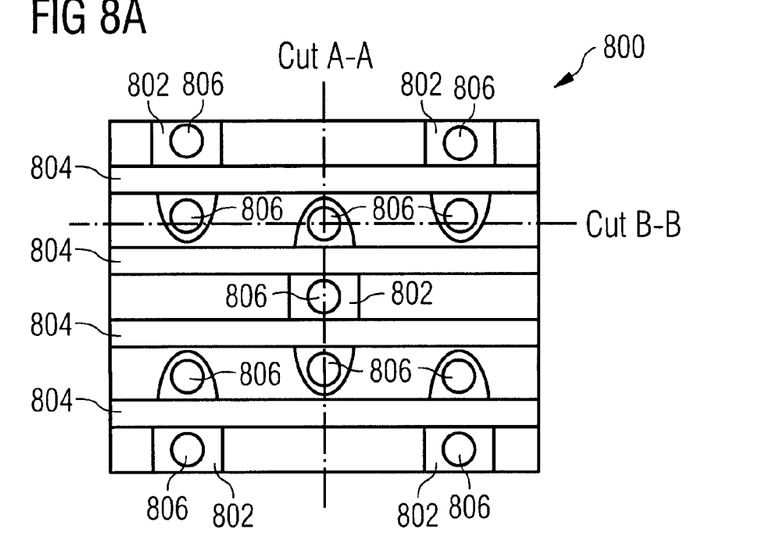
FIGS. 8A, 8B, and 8C show a top view and cross section views of a memory array in accordance with an embodiment of the invention, following an intermediate step in the manufacture of the memory array.
Figure 8B:
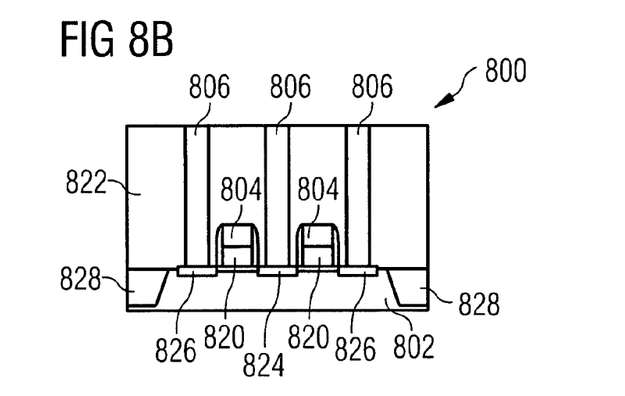
Figure 8C:
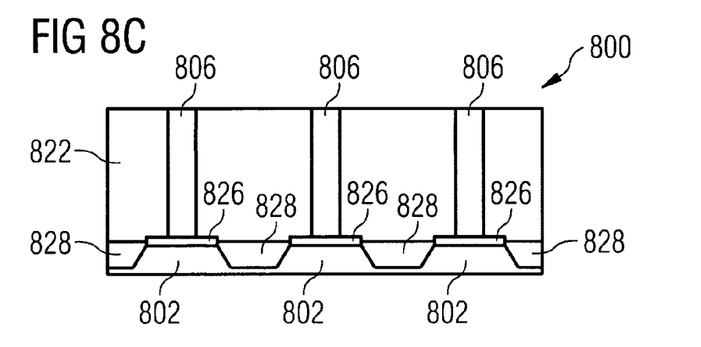

FIGS. 8A-8C illustrate one intermediate step in the above-described process. In particular, they show a portion of the integrated circuit following step 710, in which the contact holes are etched and filled with a material such as W, poly-Si, or carbon. FIG. 8A shows a top view of a portion of a memory array 800, including active areas 802, word lines 804, and filled contact holes 806. As can be seen from the layout of the portion of the memory array 800, the density of memory cells in an array may be increased by sharing each active area 802 (in this case, sharing a source region) between two cells, each with its own word line. The staggered arrangement of the active areas 802 also contributes to increasing the density of memory cells in the array. It will be understood that other layouts of memory cells and active areas may also be used, and that the layout shown in FIGS. 8A-8C is for the purpose of illustration.

FIG. 8B shows a cross section of the portion of the memory array 800 along Cut A-A of FIG. 8A. This cross section shows one active area 802, and two word lines 804, connected to transistor gates 820. Filled contact holes 806 have been etched through an SiO$_2$ layer 822 to connect to a source contact area 824, and to two drain contact areas 826. The active areas 802 are separated by STI areas 828.

FIG. 8C shows a second cross section of the portion of the memory array 800 along Cut B-B of FIG. 8A. This cross section shows portions of three active areas 802, separated by STI areas 828. Filled contact holes 806, etched through the SiO$_2$ layer 822 connect to drain contact areas 826.

Figure 9A:
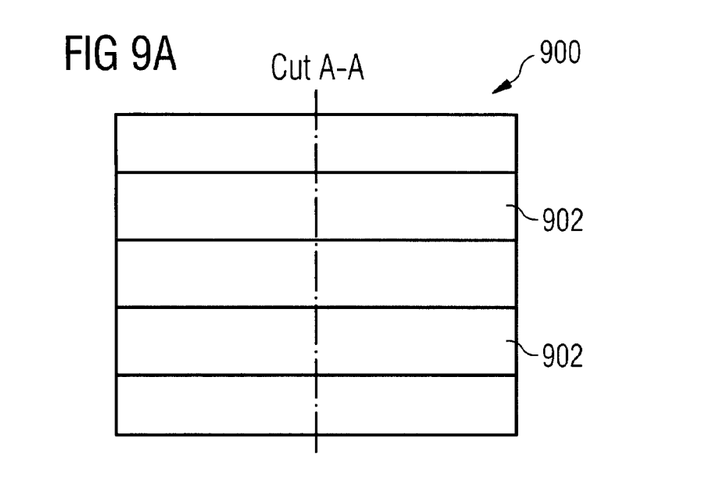
FIGS. 9A and 9B show a top view and a cross section view of a memory array in accordance with an embodiment of the invention, following another step in the manufacture of the memory array.
Figure 9B:
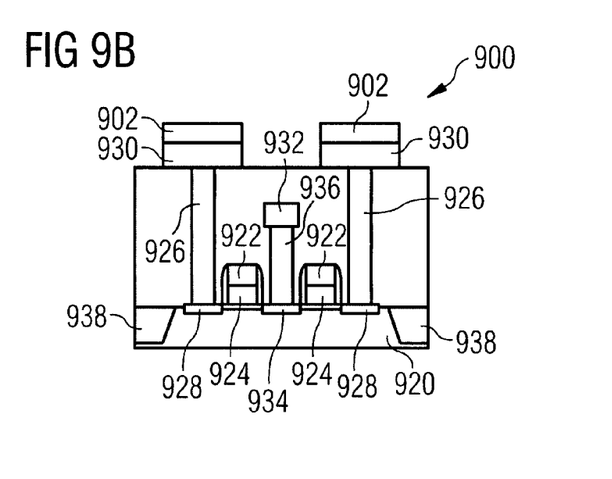

FIGS. 9A and 9B show a similar view, following step 720 of the method 700, described above with reference to FIG. 7. FIG. 9A is a top view, showing the portion of a memory array 900, which is the same as the portion of the memory array 800 described with reference to FIGS. 8A-8C, but at a later stage in processing. As can be seen, the portion of the memory array 900 now includes top electrodes 902, which are deposited above carbon bi-layer memory junctions.

FIG. 9B shows a cross section of the portion of the memory array 900 along Cut A-A, which is similar in location to the cross section shown above in FIG. 8B. The cross section shows an active area 920, and two word lines 922, connected to transistor gates 924. Vias (or contact plugs) 926 connect to two drain contact areas 928, and to carbon bi-layer memory junctions 930, which are connected to top electrodes 902. A bit line 932 connects to a source contact region 934 through a via 936. STI areas 938 separate the active area 920 from other active areas.

As can be seen in this cross section, the bit line 932, via 936, and source contact region 934 are shared by two memory cells, each of which includes a transistor and a carbon bi-layer memory junction 930. It will be understood that other layouts for memory cells may be used in accordance with the principles of the invention.

Memory cells such as are described above may be used in memory devices that contain large numbers of such cells. These cells may, for example, be organized into an array of memory cells having numerous rows and columns of cells, each of which stores one or more bits of information. Memory devices of this sort may be used in a variety of applications or systems, such as the illustrative system shown in FIG. 10.

Figure 10:
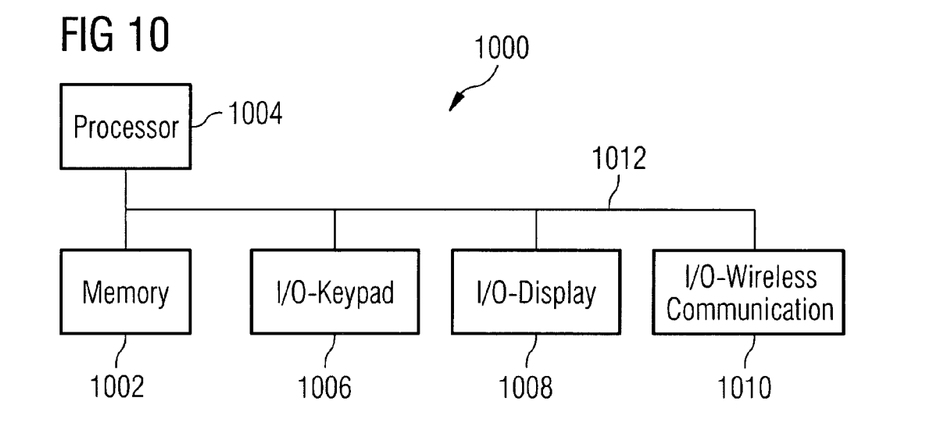
FIG. 10 shows an example computing system including a memory device using memory cells in accordance with an embodiment of the invention.

FIG. 10 shows an example computing system that uses a memory device constructed of memory cells in accordance with the invention. The computing system 1000 includes a memory device 1002, which may utilize memory cells in accordance with the invention. The system also includes a processor 1004, and one or more input/output devices, such as a keypad 1006, display 1008, and wireless communication device 1010. The memory device 1002, processor 1004, keypad 1006, display 1008 and wireless communication device 1010 are interconnected by a bus 1012.

The wireless communication device 1010 may include circuitry (not shown) for sending and receiving transmissions over a cellular telephone network, a WiFi wireless network, or other wireless communication network. It will be understood that the variety of input/output devices shown in FIG. 10 is merely an example, in which the computing system 1000 may be configured as a cellular telephone or other wireless communications device. Memory devices including memory cells in accordance with the invention may be used in a wide variety of systems. Alternative system designs may include different input/output devices, multiple processors, alternative bus configurations, and many other configurations.

Figure 11A:
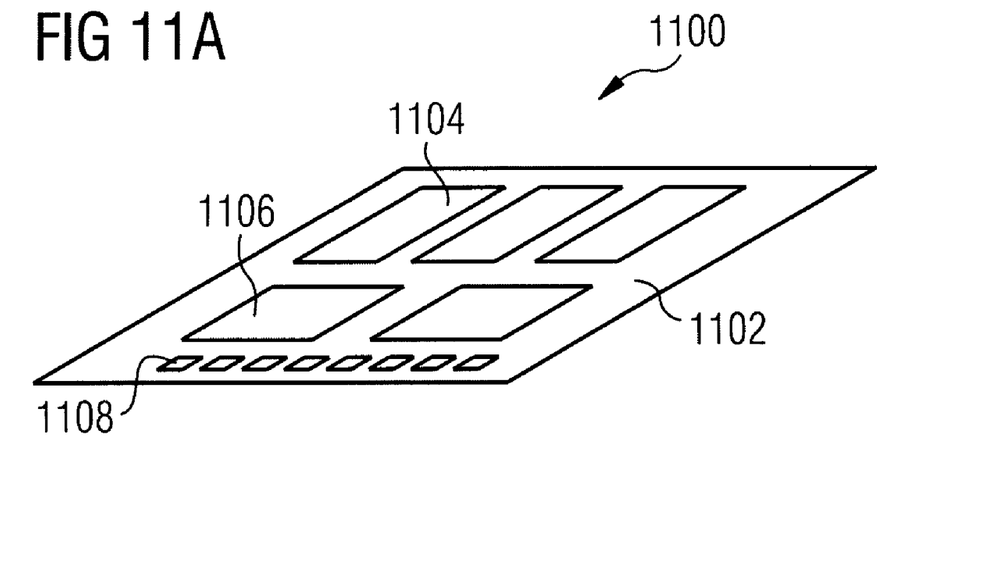
FIGS. 11A and 11B show a memory module and a stackable memory module, respectively, using memory cells in accordance with an embodiment of the invention.
Figure 11B:
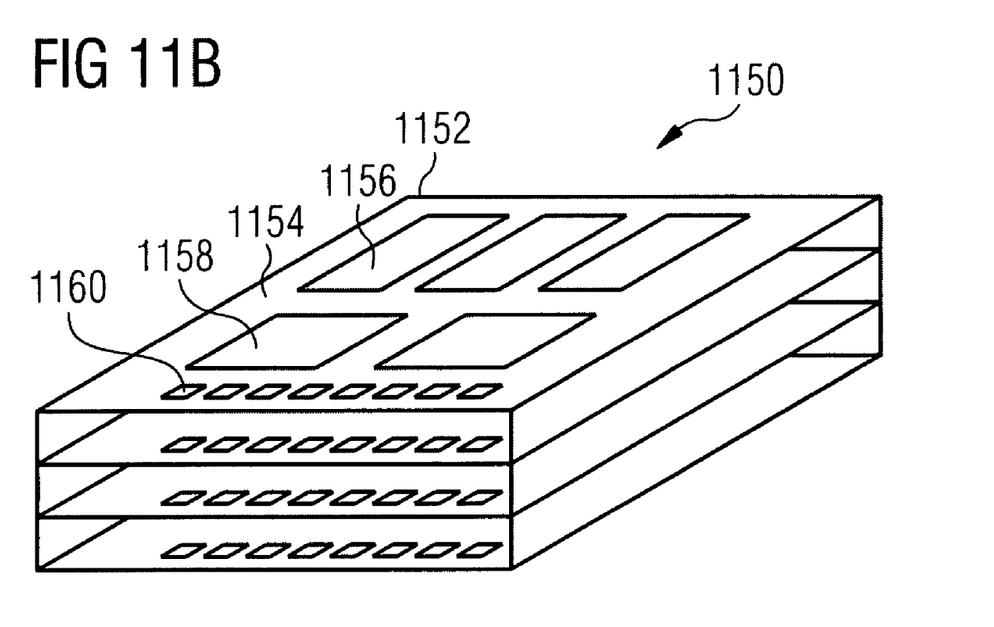

As shown in FIGS. 11A and 11B, in some embodiments, memory cells such as those described above may be used in modules. In FIG. 11A, a memory module 1100 is shown, on which one or more memory devices 1104 are arranged on a substrate 1102. The memory device 1104 may include numerous memory cells, each of which uses a memory element as described above. The memory module 1100 may also include one or more electronic devices 1106, which may include memory, processing circuitry, control circuitry, addressing circuitry, bus interconnection circuitry, or other circuitry or electronic devices that may be combined on a module with a memory device, such as the memory device 1104. Additionally, the memory module 1100 includes multiple electrical connections 1108, which may be used to connect the memory module 1100 to other electronic components, including other modules.

As shown in FIG. 11B, in some embodiments, these modules may be stackable, to form a stack 1150. For example, a stackable memory module 1152 may contain one or more memory devices 1156, arranged on a stackable substrate 1154. The memory device 1156 contains memory cells that employ memory elements such as are described above. The stackable memory module 1152 may also include one or more electronic devices 1158, which may include memory, processing circuitry, control circuitry, addressing circuitry, bus interconnection circuitry, or other circuitry or electronic devices that may be combined on a module with a memory device, such as the memory device 1156. Electrical connections 1160 are used to connect the stackable memory module 1152 with other modules in the stack 1150, or with other electronic devices. Other modules in the stack 1150 may include additional stackable memory modules, similar to the stackable memory module 1152 described above, or other types of stackable modules, such as stackable processing modules, control modules, communication modules, or other modules containing electronic components.

Figure 12:
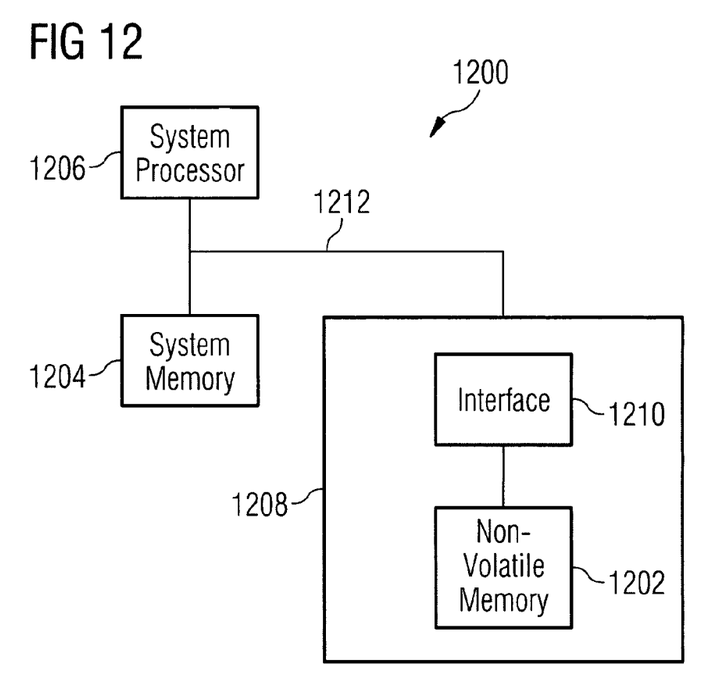
FIG. 12 shows a system that emulates a mass storage device using a non-volatile memory device according to an embodiment of the invention.

In some embodiments, a memory such as is described above may be used to improve the performance of a system. FIG. 12 shows a system 1200, in which a non-volatile memory 1202 according to an embodiment of the invention is used to emulate a hard drive or other mass storage device. Because the non-volatile memory 1202 has a faster access time than a typical hard drive, by storing commonly-used software and data on the non-volatile memory device, the performance of the system may be improved.

In this example, the system 1200 includes a system memory 1204, a system processor 1206, and an integrated circuit package 1208. The integrated circuit package 1208 includes the non-volatile memory 1202, and a controller 1210. A system bus 1212 interconnects the system memory 1204, the system processor 1206, and the integrated circuit package 1208. It will be understood that a variety of other devices (not shown) may also be interconnected on the system bus 1212, such as a variety of input/output devices (not shown), additional processors (not shown), or other devices suitable for use with a computing system.

The non-volatile memory 1202 includes memory cells in accordance with an embodiment of the invention, as described above. Within the integrated circuit package 1208, the non-volatile memory 1202 is connected to the controller 1210, which interfaces the non-volatile memory 1202 to the system bus 1212. Depending on the nature of the system bus 1212, the controller 1210 may emulate the interface of a hard disk or other mass storage device. The system memory 1204 may include conventional memory, such as conventional DRAM, or may include memory cells in accordance with the invention, as described above.

The non-volatile memory 1202 may be used to improve the performance and reliability of the system 1200 by storing commonly used applications and data. For example, the non-volatile memory 1202 may store software components of an operating system. In some embodiments, the non-volatile memory 1202 may store software for emulating a hard disk or other mass storage device. In some such systems, the controller 1210 may include the ability to intercept a system boot process (such as a BIOS boot process on some computer systems), and install the software for emulating a hard disk from the non-volatile memory 1202 to the system memory 1204. In some embodiments, the non-volatile memory 1202 may be arranged so that it is accessed in a block-oriented manner, providing access to blocks of data, similar to the block-oriented manner in which data are arranged on a conventional hard disk drive. Generally the size of a block of data will depend on the amount of storage in the non-volatile memory, and typically ranges from 512 bytes to 64 kilobytes or more, though other block sizes may also be used.

It will be understood that the system shown in FIG. 12 is an example, and that many other system configurations may be used in accordance with embodiments of the invention. Alternative system configurations may include a variety of input/output devices, multiple processors, alternative bus configurations, and many other configurations of a computing system. Additionally, it will be understood that the components shown in FIG. 12 may be separate, or may be integrated into a single device or module, or into multiple devices and modules. For example, the system processor 1206 may be integrated into a single device with the system memory 1204 and one or more input/output devices. If will further be understood that a system such as is shown in FIG. 12 may be configured for general use, or for special purposes, such as cellular or wireless communication, photography, playing music or other digital media, or other purposes.

Figure 13:
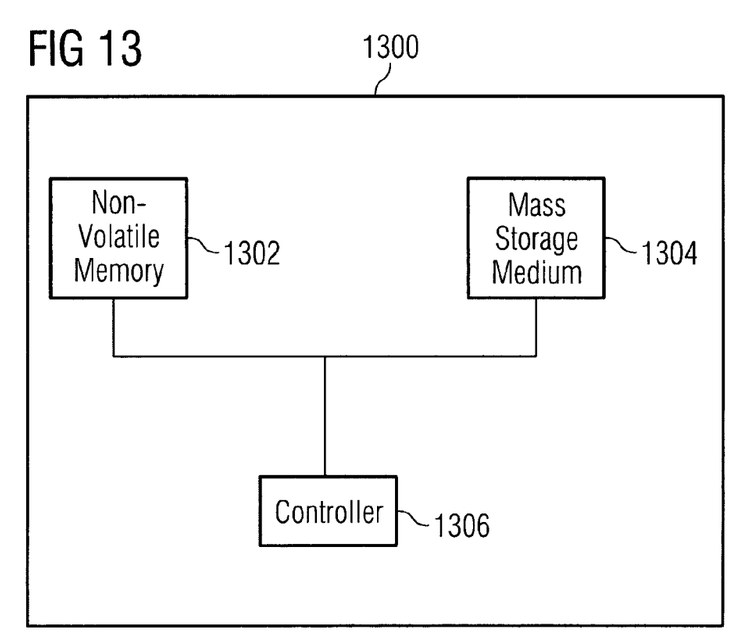
FIG. 13 shows a block diagram of a hybrid mass storage device that stores data to a mass storage device or to a non-volatile memory device according to an embodiment of the invention.

In some embodiments, a memory such as is described above may be used in hybrid mass storage devices, such as a hybrid hard disk drive, as shown in FIG. 13. The hybrid drive 1300 shown in FIG. 13 includes a non-volatile memory 1302 that includes memory cells in accordance with an embodiment of the invention, as described above. Additionally, the hybrid drive 1300 includes a second mass storage medium 1304, such as a conventional magnetic hard disk or an optical disk, and a controller 1306. The controller 1306 is connected to the non-volatile memory 1302 and to the second mass storage medium 1304, and routes requests to access data storage to either the non-volatile memory 1302, the second mass storage medium 1304, or to both. In some embodiments, the controller 1306 may be combined with a mass storage device controller, such as a hard disk drive controller or an optical drive controller, and may handle the functions of a conventional mass storage device controller in addition to routing access requests to the non-volatile memory 1302 or the second mass storage medium 1304.

The hybrid drive 1300 is used in the same manner as a conventional hard disk drive, and generally will have the same appearance, dimensions, and interface as a conventional disk drive device or other mass storage device. However, because the non-volatile memory 1302 typically has a faster access time than the second mass storage medium 1304, and typically requires less power, the hybrid drive 1300 may achieve higher performance and lower power use than a conventional hard disk drive, by storing a portion of the data, such as frequently used data, in the non-volatile memory, rather than on the second mass storage medium.

Blocks of data on the hybrid drive 1300 may be accessed according to a block address, in a manner similar to those used with a conventional hard disk drive or other mass storage device. Based on the address, the controller 1306 may direct the request to the non-volatile memory 1302 or to the second mass storage medium 1304. In some embodiments, this is accomplished using address mapping to determine how to direct access requests. This mapping may be stored in a table or other data structure that is used by the controller 1306 to route the access requests. Since most conventional mass storage devices access data in a block-oriented manner, in some embodiments, the non-volatile memory 1302 may be organized in a block-oriented manner, with block sizes typically ranging from 512 bytes to 64 kilobytes or more, though other block sizes are possible. Typically, the block size used for the non-volatile memory 1302 will be the same as the block size used for the second mass storage medium, though differing block sizes are possible, and may be used in some embodiments.

It will be understood that other configurations of a hybrid drive including a non-volatile memory may be used in accordance with an embodiment of the invention. For example, a hybrid drive may include additional mass storage devices, additional memory for use as a cache, or other configurations.

While the invention has been shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes that come within the meaning and range of equivalency of the claims are intended to be embraced.

What is claimed is:

1. An integrated circuit comprising:
 a memory element that comprises a carbon layer system comprising a first carbon layer rich in a first carbon material and a second carbon layer rich in a second carbon material;
 the memory element storing information by reversibly forming a conductive channel in the second carbon layer, the conductive channel comprising the first carbon material.

2. The integrated circuit of claim 1, wherein the first carbon material comprises $sp^2$ hybridized amorphous carbon.

3. The integrated circuit of claim 1, wherein the second carbon material comprises $sp^3$ hybridized amorphous carbon.

4. A memory element comprising:
 a carbon layer system comprising a first carbon layer rich in a first carbon material and a second carbon layer rich in a second carbon material;
 the memory element storing information by reversibly forming a conductive channel in the second carbon layer, the conductive channel comprising the first carbon material.

5. The memory element of claim 4, wherein the first carbon material comprises $sp^2$ hybridized amorphous carbon.

6. The memory element of claim 4, wherein the second carbon material comprises $sp^3$ hybridized amorphous carbon.

7. The memory element of claim 4, wherein the second carbon layer has a thickness of 5 nm or less.

8. The memory element of claim 4, further comprising a select transistor coupled to the carbon layer system.

9. The memory element of claim 4, wherein the carbon layer system stores multiple bits of information.

10. The memory element of claim 9, wherein different resistance states of the carbon layer system are used to store the multiple bits of information.

11. The memory element of claim 4, wherein application of a first current through the carbon layer system causes formation of the conductive channel.

12. The memory element of claim 11, wherein application of a second current, having a reversed polarity with respect to the first current, causes reduction of the conductive channel.

13. An integrated circuit comprising:
a memory element that comprises a carbon layer system, comprising a first carbon layer, having a first resistance R1, and a second carbon layer, having a second resistance R2, such that a ratio R2/R1 is greater than 100.

14. A computing system comprising:
an input apparatus;
an output apparatus;
a processing apparatus; and
a memory, said memory comprising a carbon layer system comprising a first carbon layer rich in a first carbon material and a second carbon layer rich in a second carbon material, wherein information can be stored in the memory by reversibly forming a conductive channel in the second carbon layer, the conductive channel comprising the first carbon material.

15. The computing system of claim 14, wherein the first carbon material comprises $sp^2$ hybridized amorphous carbon.

16. The computing system of claim 14, wherein the second carbon material comprises $sp^3$ hybridized amorphous carbon.

17. A memory module comprising:
a multiplicity of integrated circuits, wherein each integrated circuit of the multiplicity of integrated circuits comprises a carbon layer system comprising a first carbon layer rich in a first carbon material and a second carbon layer rich in a second carbon material, the carbon layer system storing information by reversibly forming a conductive channel in the second carbon layer, the conductive channel comprising the first carbon material.

18. The memory module of claim 17, wherein the first carbon material comprises $sp^2$ hybridized amorphous carbon.

19. The memory module of claim 17, wherein the second carbon material comprises $sp^3$ hybridized amorphous carbon.

20. The memory module of claim 17, wherein the memory module is stackable.

21. A system comprising:
a system memory;
a processor;
an integrated circuit memory device, the integrated circuit memory device comprising a controller that interfaces the integrated circuit memory device to a bus, and a non-volatile memory comprising a carbon layer system comprising a first carbon layer rich in a first carbon material and a second carbon layer rich in a second carbon material, the carbon layer system storing information by reversibly forming a conductive channel in the second carbon layer, the conductive channel comprising the first carbon material; and
the bus that interconnects the system memory, the processor, and the integrated circuit memory device.

22. The system of claim 21, wherein the first carbon material comprises $sp^2$ hybridized amorphous carbon.

23. The system of claim 21, wherein the second carbon material comprises $sp^3$ hybridized amorphous carbon.

24. The system of claim 21, wherein the non-volatile memory stores software that emulates a mass storage device.

25. The system of claim 24, wherein the controller intercepts a system boot process and installs the software that emulates the mass storage device from the non-volatile memory to the system memory.

26. The system of claim 21, wherein the non-volatile memory stores software and data that are frequently used by the system.

27. The system of claim 21, wherein the non-volatile memory stores portions of operating system software for the system.

28. The system of claim 21, wherein the non-volatile memory is block-oriented.

29. A hybrid mass storage system comprising:
a non-volatile memory comprising a memory element that comprises a carbon layer system comprising a first carbon layer rich in a first carbon material and a second carbon layer rich in a second carbon material, the memory element storing information by reversibly forming a conductive channel in the second carbon layer, the conductive channel comprising the first carbon material; and
a second mass storage medium.

30. The hybrid mass storage system of claim 29, wherein the first carbon material comprises $sp^2$ hybridized amorphous carbon.

31. The hybrid mass storage system of claim 29, wherein the second carbon material comprises $sp^3$ hybridized amorphous carbon.

32. The hybrid mass storage system of claim 29, wherein the second mass storage medium comprises a hard disk drive.

33. The hybrid mass storage system of claim 29, wherein the second mass storage medium comprises an optical drive.

34. The hybrid mass storage system of claim 29, wherein the non-volatile memory has a faster access time than the second mass storage medium.

35. The hybrid mass storage system of claim 29, wherein the non-volatile memory uses less power than the second mass storage medium.

36. The hybrid mass storage system of claim 29, wherein the non-volatile memory is block-oriented.

37. The hybrid mass storage system of claim 29, wherein the non-volatile memory and the second mass storage medium are contained in a disk drive device.

38. The hybrid mass storage system of claim 29, further comprising a controller coupled to the non-volatile memory and the second mass storage medium, the controller selectively directing access requests to the non-volatile memory and the second mass storage medium.

39. The hybrid mass storage system of claim 38, wherein the controller selectively directs access requests to the non-volatile memory and the second mass storage medium based on an address of the request.

40. The hybrid mass storage system of claim 39, wherein the controller uses an address mapping to selectively direct access requests.

41. A hard disk drive device comprising:
a hard disk storage medium;
a non-volatile memory comprising a memory element that comprises a carbon layer system comprising a first carbon layer rich in a first carbon material and a second carbon layer rich in a second carbon material, the memory element storing information by reversibly forming a conductive channel in the second carbon layer, the conductive channel comprising the first carbon material; and a controller coupled to the hard disk storage medium and the non-volatile memory, the controller selectively directing access requests to the non-volatile memory and second mass storage medium based on a requested address.

42. The hard disk drive device of claim 41, wherein the controller is integrated with a hard disk controller.

43. The hard disk drive device of claim 41, wherein the non-volatile memory is block-oriented.

44. The hard disk drive device of claim 41, wherein the non-volatile memory has a faster access time than the hard disk storage medium.

* * * * *